(12) United States Patent
 Kajiyama

(10) Patent No.: US 9,130,034 B2
(45) Date of Patent: Sep. 8, 2015

(54) SEMICONDUCTOR DEVICE AND METHOD OF MANUFACTURING THE SAME

(71) Applicant: Takeshi Kajiyama, Seoul (KR)

(72) Inventor: Takeshi Kajiyama, Seoul (KR)

( * ) Notice: Subject to any disclaimer, the term of this patent is extended or adjusted under 35 U.S.C. 154(b) by 0 days.

(21) Appl. No.: 14/101,131

(22) Filed: Dec. 9, 2013

(65) Prior Publication Data

US 2015/0069479 A1    Mar. 12, 2015

Related U.S. Application Data

(60) Provisional application No. 61/875,554, filed on Sep. 9, 2013.

(51) Int. Cl.
| | | |
|---|---|---|
| *H01L 27/108* | (2006.01) | |
| *H01L 29/78* | (2006.01) | |
| *H01L 27/22* | (2006.01) | |
| *H01L 29/66* | (2006.01) | |
| *H01L 29/10* | (2006.01) | |

(52) U.S. Cl.
CPC .......... *H01L 29/7813* (2013.01); *H01L 27/228* (2013.01); *H01L 29/1095* (2013.01); *H01L 29/66734* (2013.01); *H01L 27/10888* (2013.01)

(58) Field of Classification Search
CPC ................ H01L 27/108; H01L 27/115; H01L 27/10852; H01L 27/10894; H01L 27/10885
USPC .......................................... 257/295, 396, 300
See application file for complete search history.

(56) References Cited

U.S. PATENT DOCUMENTS

| | | | |
|---|---|---|---|
| 8,009,464 B2 * | 8/2011 | Kajiyama ...................... 365/158 |
| 8,395,198 B2 | 3/2013 | Uchiyama | |
| 2012/0161227 A1 | 6/2012 | Oyu | |
| 2012/0286358 A1 | 11/2012 | Sammi | |

OTHER PUBLICATIONS

G. Navarro, et al.: "High temperature reliability of µtrench Phase-Change Memory devices", Microelectronics Reliability 52(2012) 1928-1931 (in English).

* cited by examiner

*Primary Examiner* — Quoc Hoang
(74) *Attorney, Agent, or Firm* — Holtz, Holtz, Goodman & Chick PC

(57) ABSTRACT

According to an embodiment, semiconductor device includes a semiconductor substrate, first and second isolation regions provided in the semiconductor substrate, extending in a first direction, and adjacent to each other, first and second word lines provided in the semiconductor substrate, extending in a second direction crossing the first direction, and adjacent to each other, first and second upper insulating regions provided on the first and second word lines, extending in the second direction, and adjacent to each other, a source/drain diffusion region provided in a surface area of the semiconductor substrate and between the first and second isolation regions, and including a portion positioned between the first and second upper insulating regions, and a first conductive portion provided in the source/drain diffusion region and formed of a material containing metal.

20 Claims, 8 Drawing Sheets

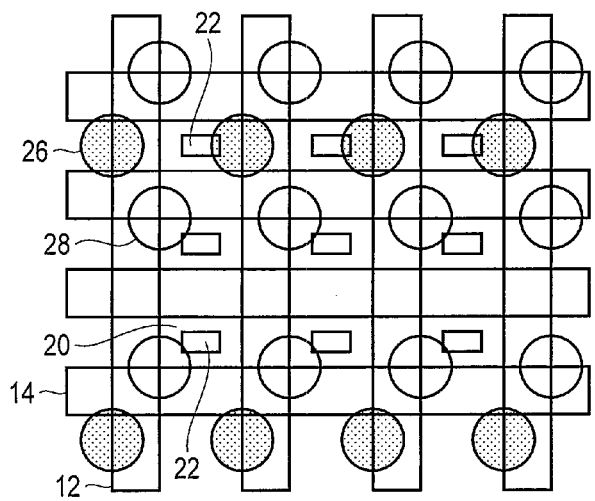
F I G. 1
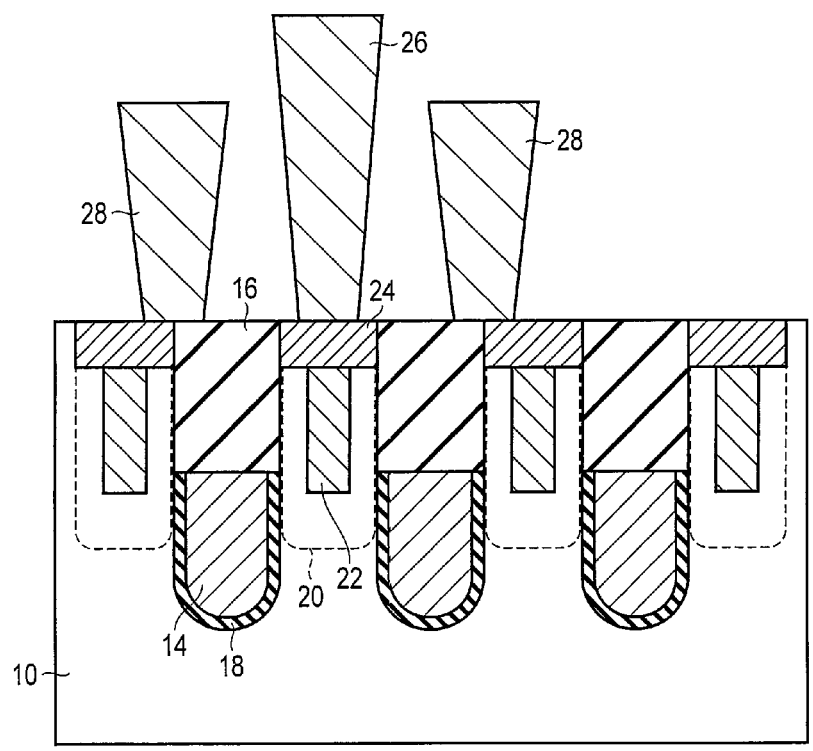
F I G. 2

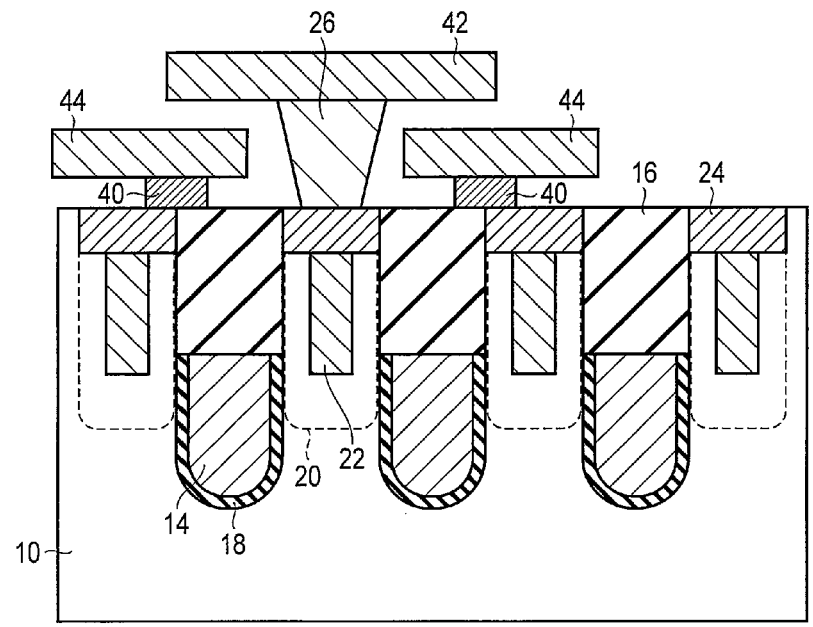
F I G. 11
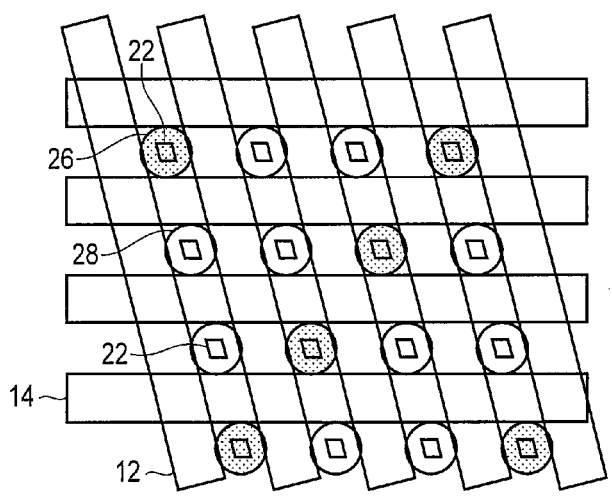
F I G. 12

SEMICONDUCTOR DEVICE AND METHOD OF MANUFACTURING THE SAME

CROSS-REFERENCE TO RELATED APPLICATIONS

This application claims the benefit of U.S. Provisional Application No. 61/875,554, filed Sep. 9, 2013, the entire contents of which are incorporated herein by reference.

FIELD

Embodiments described herein relate generally to a semiconductor device and a method of manufacturing the same.

BACKGROUND

If a magnetic random access memory (MRAM) or a dynamic random access memory (DRAM) is miniaturized, a contact area between a source/drain diffusion region of a MOS transistor and a contact plug is decreased. Consequently, the contact resistance between the source/drain diffusion region and the contact plug is increased, which adversely affects device operation.

Therefore, what is desired is a semiconductor device in which the resistance in a source/drain diffusion area can be reduced.

BRIEF DESCRIPTION OF THE DRAWINGS

FIG. 1 is a plan view which schematically illustrates a positional relationship of structural elements of a semiconductor device according to a first embodiment;

FIG. 2 is a cross-sectional view which schematically illustrates a structure of the semiconductor device according to the first embodiment;

FIG. 11 is a cross-sectional view which schematically illustrates another example of a structure when the semiconductor device according to the first embodiment is applied to an MRAM;

FIG. 12 is a plan view which schematically illustrates a positional relationship of structural elements of a semiconductor device according to a second embodiment;

DETAILED DESCRIPTION

Figure 3:
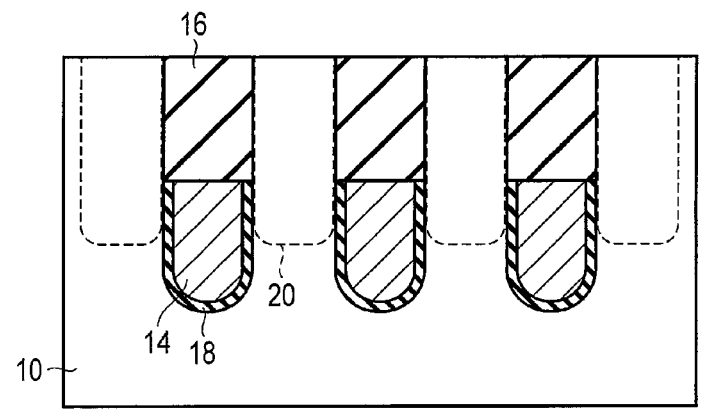
FIG. 3 is a cross-sectional view which schematically illustrates a part of a method of manufacturing the semiconductor device according to the first embodiment.

According to an embodiment, a semiconductor device includes: a semiconductor substrate; a first isolation region and a second isolation region provided in the semiconductor substrate, extending in a first direction, and being adjacent to each other; a first word line and a second word line provided in the semiconductor substrate, extending in a second direction crossing the first direction, and being adjacent to each other; a first upper insulating region and a second upper insulating region provided on the first word line and the second word line, respectively, extending in the second direction, and being adjacent to each other; a source/drain diffusion region provided in a surface area of the semiconductor substrate and between the first isolation region and the second isolation region, and including a portion positioned between the first upper insulating region and the second upper insulating region; and a first conductive portion provided in the source/drain diffusion region and formed of a material containing metal.

Embodiments will be hereinafter described with reference to the accompanying drawings.

(Embodiment 1)

FIG. 1 is a plan view which schematically illustrates a positional relationship of structural elements of a semiconductor device according to a first embodiment. FIG. 2 is a cross-sectional view which schematically illustrates a structure of the semiconductor device according to the first embodiment.

As shown in FIGS. 1 and 2, in a semiconductor substrate (silicon substrate) 10, a plurality of isolation regions 12 and a plurality of word lines 14 are provided. Each of the isolation regions 12 extends in a first direction, and each of the word lines 14 extends in a second direction which crosses the first direction. In the present embodiment, the first and second directions cross each other orthogonally, and the isolation regions 12 and the word lines 14 cross each other orthogonally. On the word lines 14, upper insulating regions 16 extending in the second direction are provided, respectively.

A part of each of the word lines 14 functions as a gate electrode of a MOS transistor. The MOS transistor has a recess gate structure, and in a recessed area of the semiconductor substrate 10, a gate electrode 14 is formed. A gate insulating film 18 is formed between the gate electrode 14 and the semiconductor substrate 10.

In a surface area of the semiconductor substrate 10, a source/drain diffusion region 20 containing impurities (N- or P-type impurities) in high concentration is provided. The source/drain diffusion region 20 is provided between the adjacent isolation regions 12, and includes a portion positioned between the adjacent upper insulating regions 16. Further, the source/drain diffusion region 20 further includes a portion positioned between the adjacent word lines 14. That is, the source/drain diffusion region 20 is provided between stack structures, each of which is constituted by the word line 14 and the upper insulating region 16. The source/drain diffusion region 20 is provided on both sides of the gate electrode 14, and the source/drain diffusion region 20 on one of the sides is a source region and the source/drain diffusion region 20 on the other side is a drain region.

In the source/drain diffusion region 20, a conductive portion (first conductive portion) 22 which is formed of a material containing metal is provided, and the conductive portion 22 contacts the source/drain diffusion region 20. The conductive portion 22 is formed of a metal silicide. More specifically, the conductive portion 22 is formed of a silicide containing nickel (Ni) (a nickel silicide). The conductive portion 22 is distant from the isolation region 12, the word line 14, and the upper insulating region 16. Further, the bottom of the conductive portion 22 is located shallower than the bottom of the source/drain diffusion region 20. Therefore, a side surface and a lower surface of the conductive portion 22 are surrounded by the source/drain diffusion region 20.

On the conductive portion 22, a conductive portion (second conductive portion) 24 which is formed of a material containing metal is provided, and the conductive portion 24 contacts the conductive portion 22. The top surface of the conductive portion 24 is planarized. Therefore, the top surface of the conductive portion 24 is substantially on the same plane as the top surface of the isolation region 12 and the top surface of the upper insulating region 16.

As can be understood from the above, the conductive portion 22 is formed within the source/drain diffusion region 20, and the conductive portion 24 is formed on the source/drain diffusion region 20. Accordingly, a conductive portion of T-shaped cross section is formed by the conductive portions 22 and 24.

To the conductive portion 24, a contact plug (bit-line contact plug 26, source-line contact plug 28) is connected. The contact plug 26 is formed on the conductive portion 24 and the isolation region 12. The contact plug 28 is formed on the conductive portion 24, the isolation region 12, and the upper insulating region 16. In this way, the contact plugs 26 and 28 are formed over a boundary between the conductive portion 24 and the isolation region 12, and a boundary between the conductive portion 24 and the upper insulating region 16.

As described above, in the present embodiment, since the conductive portion 22 is formed in the source/drain diffusion region 20, it is possible to increase a junction area between the source/drain diffusion region 20 and the conductive portion 22. Accordingly, the contact resistance between the source/drain diffusion region 20 and the conductive portion 22 can be reduced. Further, since the conductive portion 24 is formed on the source/drain diffusion region 20, it is possible to increase the junction area and reduce the contact resistance. As a result, even if elements are miniaturized, it is possible to improve the characteristics of a semiconductor memory device, such as an MRAM or a DRAM.

FIGS. 3 to 9 each relates to a cross-sectional view which schematically illustrates a method of manufacturing the semiconductor device according to the present embodiment. The method of manufacturing the semiconductor device according to the present embodiment will now be described with reference to FIGS. 1, 2, and 3 to 9.

Firstly, as shown in FIG. 3, a plurality of isolation regions 12 extending in the first direction are formed (see FIG. 1). More specifically, trenches are formed in the semiconductor substrate (silicon substrate) 10. Each of the trenches is filled with a silicon oxide film, and the isolation region 12 of a shallow trench isolation (STI) structure having a thickness of approximately 250 nm is formed. An area between the isolation regions 12 serves as an active area.

Next, a plurality of word lines 14 extending in the second direction which crosses the first direction are formed in the semiconductor substrate 10. More specifically, trenches are formed in the semiconductor substrate (silicon substrate) 10. Each of the trenches is filled with a conductive material, and the word line 14 having a thickness of approximately 150 nm is formed. Then, a plurality of upper insulating regions 16 extending in the second direction are formed on the word lines 14, respectively. More specifically, upper parts of the trenches are filled with a silicon nitride film to form the upper insulating regions 16. A part of each of the word lines 14 functions as a gate electrode of a MOS transistor. The MOS transistor has a recess gate structure, and the gate insulating film 18 is formed between the gate electrode 14 and the semiconductor substrate 10. It is preferred that the depth of the word line 14 (depth of the gate electrode) be 0.15 μm to 0.3 μm (for example, 0.2 μm). Further, a lower part of the gate electrode may be a U-shaped Saddle-FIN structure.

Next, using the upper insulating regions 16 as a mask, impurity ion implantation is performed on a surface area of the semiconductor substrate 10. In this way, the source/drain diffusion region 20 having a depth of approximately 130 nm is formed in the surface area of the semiconductor substrate 10. The source/drain diffusion region 20 is provided between adjacent isolation regions 12, and includes a portion positioned between adjacent upper insulating regions 16. In addition, the source/drain diffusion region 20 further includes a portion positioned between adjacent word lines 14.

Figure 4:
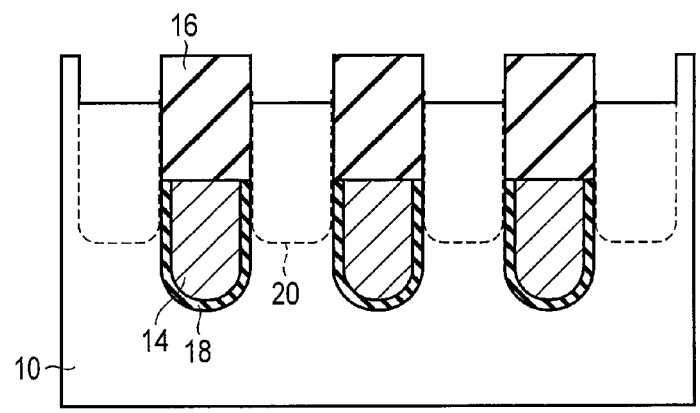
FIG. 4 is a cross-sectional view which schematically illustrates a part of the method of manufacturing the semiconductor device according to the first embodiment.

Next, as shown in FIG. 4, a surface of the source/drain diffusion region 20 is recessed by approximately 30 nm by reactive ion etching (RIE). By this recess processing, a hole (first hole) defined by the adjacent isolation regions 12 and the adjacent upper insulating regions 16 is formed in the source/drain diffusion region 20.

Figure 5:
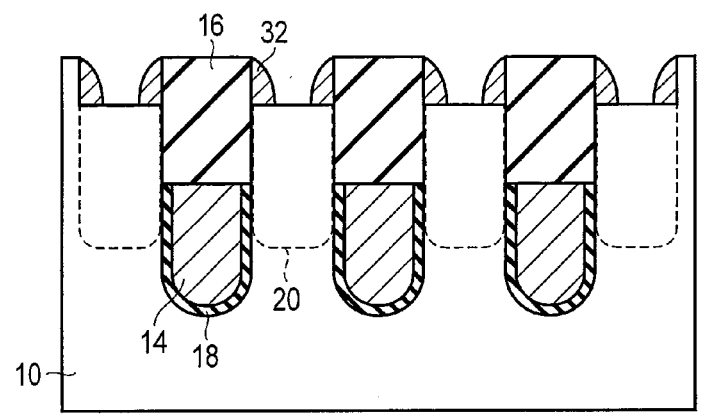
FIG. 5 is a cross-sectional view which schematically illustrates a part of the method of manufacturing the semiconductor device according to the first embodiment.

Next, as shown in FIG. 5, a Ti/TiN stacked film is formed on the entire surface as a sidewall formation film by sputtering or CVD. Then, RIE is performed for the sidewall formation film. As a result, a sidewall portion 32 formed by the Ti/TiN stacked film is formed on the source/drain diffusion region 20. That is, the sidewall portion 32 is formed on an inner sidewall of the hole defined by the adjacent isolation regions 12 and the adjacent upper insulating regions 16.

Figure 6:
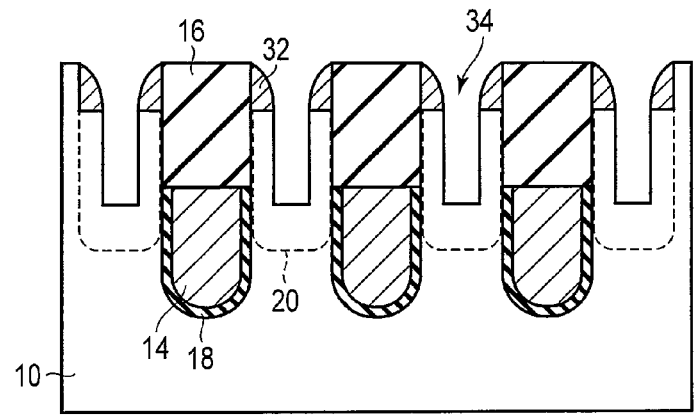
FIG. 6 is a cross-sectional view which schematically illustrates a part of the method of manufacturing the semiconductor device according to the first embodiment.

Next, as shown in FIG. 6, the sidewall portion 32, the isolation regions 12, and the upper insulating region 16 are used as a mask, and the source/drain diffusion region 20 is etched by RIE. In this way, a hole (second hole) 34 aligned with the sidewall portion 32 is formed in the source/drain diffusion region 20. The hole 34 is 70 nm in depth.

Figure 7:
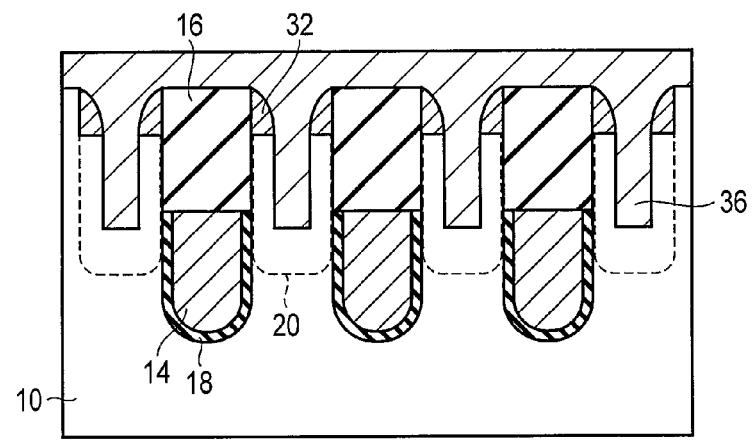
FIG. 7 is a cross-sectional view which schematically illustrates a part of the method of manufacturing the semiconductor device according to the first embodiment.

Next, as shown in FIG. 7, by sputtering or CVD, a nickel (Ni) film is formed on the entire surface as a metal film 36. In this way, the hole 34 is filled with the metal film 36.

Figure 8:
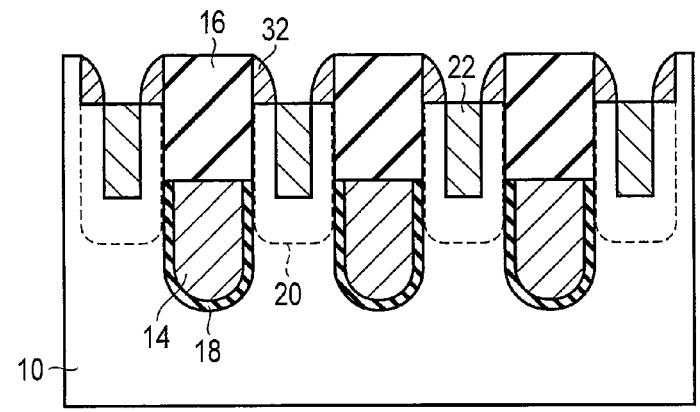
FIG. 8 is a cross-sectional view which schematically illustrates a part of the method of manufacturing the semiconductor device according to the first embodiment.

Next, as shown in FIG. 8, an annealing treatment is performed. By the annealing treatment, a metal material that constitutes the metal film 36 is converted into a silicide, and a metal silicide 22 is formed. That is, the metal film (nickel film) 36 reacts with the silicon (Si) of the source/drain diffusion region 20, and the metal silicide (nickel silicide) 22 is formed. After that, unreacted metal film (nickel film) 36 is removed by wet etching. In this way, the metal silicide (nickel silicide) 22 is formed in the hole 34 of the source/drain diffusion region 20 as a first conductive portion made of a material containing metal. Further, it is preferred that a distance between the bottom of the metal silicide 22 and the bottom of the source/drain diffusion region 20 be 0.1 μm or more.

Figure 9:
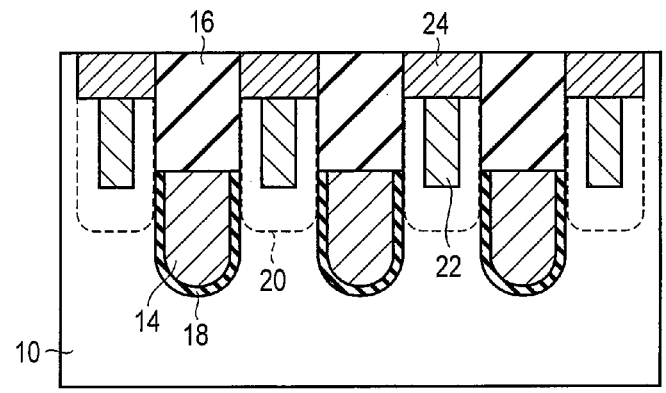
FIG. 9 is a cross-sectional view which schematically illustrates a part of the method of manufacturing the semiconductor device according to the first embodiment.

Next, as shown in FIG. 9, a TiN film is formed on the entire surface as a metal film. Further, the metal film (TiN film) is planarized by a chemical mechanical polishing (CMP). In this way, on the metal silicide (first conductive portion) 22, a metal conductive portion (second conductive portion) 24 that is made of a material containing metal is formed.

After that, the contact plugs 26 and 28 and the like, which are connected to the metal conductive portion 24, are formed, as shown in FIG. 2.

As can be seen, in the manufacturing method described above, the sidewall portion 32 is used as a mask to form the hole (second hole) 34 in the source/drain diffusion region 20, and the conductive portion (first conductive portion) 22 is formed in the hole 34. In this way, the conductive portion 22 can be certainly formed in the source/drain diffusion region 20. Accordingly, as already described, the contact resistance of the source/drain diffusion region 20 can be reduced, and the characteristics of a semiconductor memory device, such as an MRAM or a DRAM, can be improved.

Moreover, since the first conductive portion 22 is formed by converting the metal material that fills the hole (second hole) 34 into a silicide, the conductive portion 22 can be precisely formed in the hole 34. In particular, by using the nickel silicide as a silicide, the conductive portion 22 can be more precisely formed. That is, the nickel silicide can be formed to be thin and in uniform thickness, and with good controllability. Therefore, a junction between the nickel silicide (conductive portion) 22 and the source/drain diffusion region 20 (in particular, a junction in a lateral direction) can be secured.

In the above-described embodiment, while the sidewall portion 32 was formed by a Ti/TiN stacked film, the sidewall portion 32 may be formed by a nickel film (Ni film). In this case, the nickel film that constitutes the sidewall portion 32 and the nickel film 36 formed in the step of FIG. 7 are continuous. Thus, in the annealing treatment of FIG. 8, a part of the sidewall portion 32 can be converted into a nickel silicide.

Moreover, the sidewall portion 32 may be formed by a conductive material, such as a cobalt silicide, a nickel silicide, tungsten (W), tantalum (Ta), and tantalum nitride (TaN). In this case, it is preferred that high etching selectivity (for example, etching selectivity of three or more) be obtained with respect to the insulating film (for example, silicon oxide film) to be used for the isolation regions 12 and the insulating film (for example, silicon nitride film) to be used for the upper insulating regions 16.

Furthermore, the sidewall portion 32 may be formed with an insulating material, such as a silicon oxide film or a silicon nitride film. In this case, after forming the conductive portion 22 in the step of FIG. 8, it is preferred that the sidewall portion 32 be removed. However, if the sidewall portion 32 is to be formed by a silicon oxide film, in removing the sidewall portion 32, the degree of etching of the silicon oxide film to be used for the isolation regions 12 needs to be accurately managed. In addition, if the sidewall portion 32 is to be formed by a silicon nitride film, in removing the sidewall portion 32, the degree of etching of the silicon nitride film to be used for the upper insulating regions 16 needs to be accurately managed.

Further, in the embodiment described above, while a nickel silicide was formed as the metal silicide 22, a cobalt (Co) silicide may be used. In this case, a cobalt film (Co film) is formed as the metal film 36 in the step of FIG. 7, and a cobalt silicide is formed by the annealing treatment of FIG. 8. A nickel silicide is superior in the point that a silicide which is thin and in uniform thickness can be formed. However, a cobalt silicide is superior in its resistance to heat. Therefore, if a high-temperature process is to be carried out later, a cobalt silicide may be used.

Furthermore, in the above embodiment, while the metal silicide 22 was formed by the annealing treatment, the metal silicide 22 may be formed by deposition. In this case, instead of forming the metal film 36 in the step of FIG. 7, a metal silicide film (for example, a nickel silicide film) is to be deposited and an upper part of the metal silicide film should be thereafter removed so that a lower part of the metal silicide film is left in the hole 34.

Furthermore, in the above embodiment, while a metal silicide was used for the first conductive portion 22, the first conductive portion 22 may be formed by metal. In this case, after forming the metal film 36 in the step of FIG. 7, an upper part of the metal film is to be removed so that a lower part of the metal film is left in the hole 34.

Figure 10:
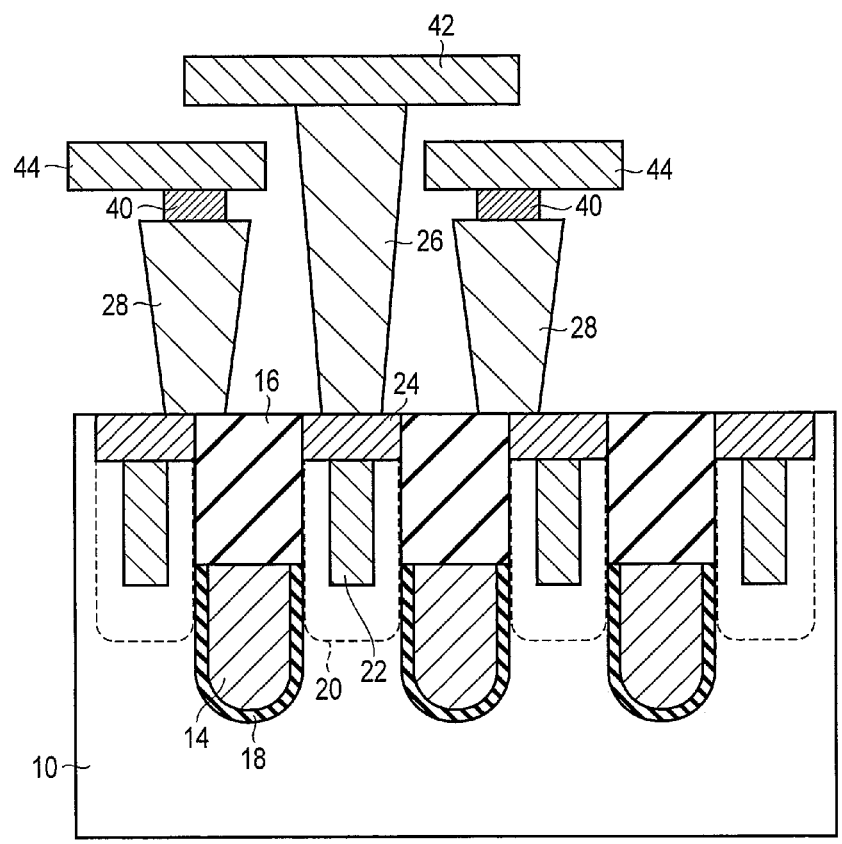
FIG. 10 is a cross-sectional view which schematically illustrates an example of a structure when the semiconductor device according to the first embodiment is applied to an MRAM.

FIG. 10 is a cross-sectional view which schematically illustrates an example of a case in which the structure of the embodiment described above is applied to an MRAM. In the example shown in FIG. 10, a magnetic storage element 40 is formed on the contact plug 28, and a source line 44 is connected to the magnetic storage element 40. In addition, a bit line 42 is connected to the contact plug 26. By this structure, the magnetic storage element 40 is electrically connected to the first conductive portion 22. That is, the magnetic storage element 40 is electrically connected to the source/drain diffusion region 20 of the MOS transistor.

FIG. 11 is a cross-sectional view which schematically illustrates another example of a case in which the structure of the above embodiment is applied to an MRAM. In the example shown in FIG. 11, the magnetic storage element 40 is directly connected to the second conductive portion 24 without using the contact plug 28.

It should be noted that in the examples shown in FIGS. 10 and 11, a magnetoresistance effect element (magnetic tunnel junction (MTJ) element), for example, can be used for the magnetic storage element 40. A large current is required for the MTJ element when writing. Application of the structure of the present embodiment can reduce the contact resistance, and therefore, a large current can be passed to the MTJ element.

(Embodiment 2)

Next, a second embodiment will be described. Since the basic structure and the manufacturing method are similar to those of the first embodiment, explanation of the matters already described in the first embodiment is omitted.

FIG. 12 is a plan view which schematically illustrates a positional relationship of structural elements of a semiconductor device according to the second embodiment. Structural elements corresponding to those shown in FIG. 1 of the first embodiment are denoted by the same reference numerals as in the first embodiment, and their detailed explanations is omitted.

In the present embodiment, as shown in FIG. 12, isolation regions 12 cross word lines 14 and upper insulating regions provided over the word lines 14 obliquely. That is, a direction of extension of the isolation regions 12 (a first direction) and a direction of extension of the word line 14 (a second direction) cross each other obliquely.

Also in the present embodiment, the contact resistance can be reduced and an advantage similar to that of the first embodiment can be obtained.

(Embodiment 3)

Next, a third embodiment will be described. Since the basic structure and the manufacturing method are similar to those of the first embodiment, explanation of the matters already described in the first embodiment is omitted.

Figure 13:
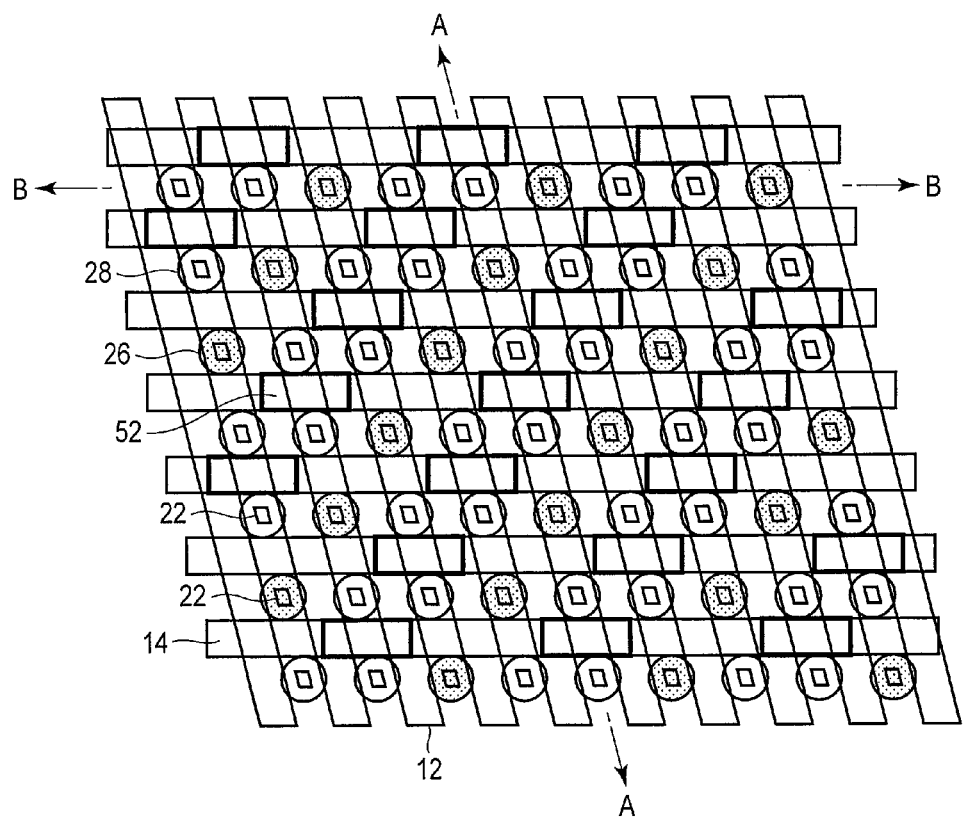
FIG. 13 is a plan view which schematically illustrates a positional relationship of structural elements of a semiconductor device according to a third embodiment.
Figure 14:
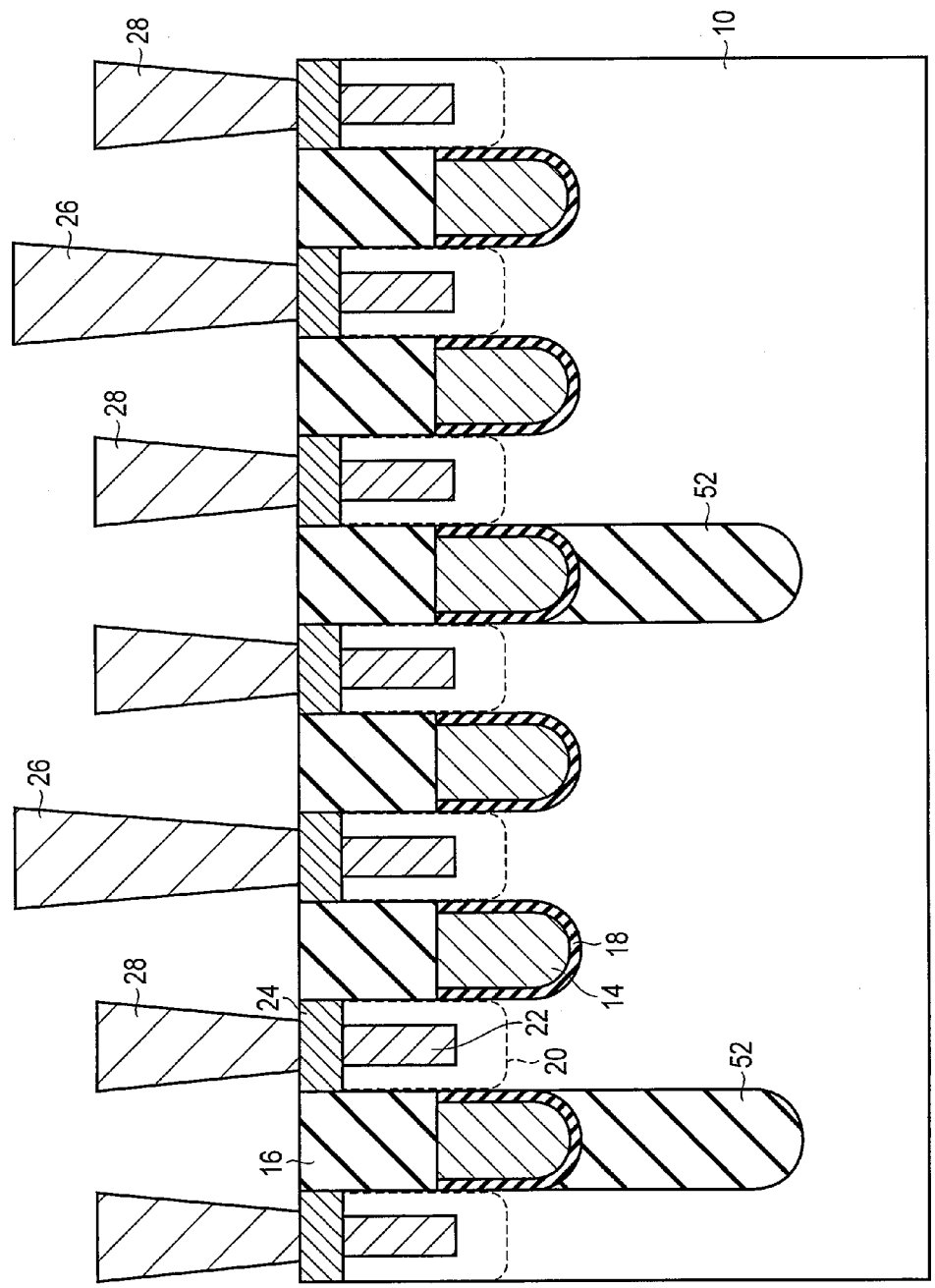
FIG. 14 is cross-sectional view which schematically illustrates a structure of the semiconductor device according to the third embodiment.
Figure 15:
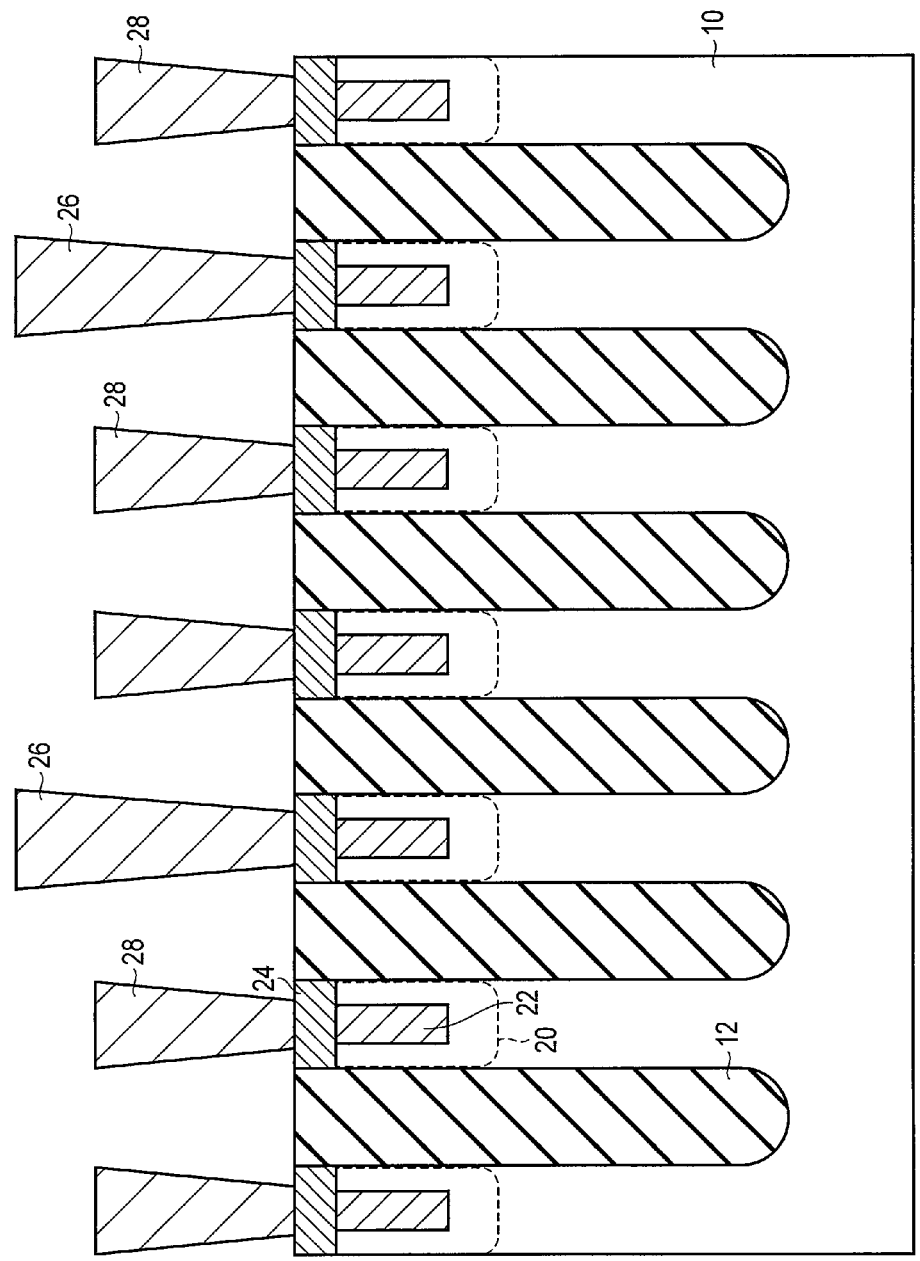
FIG. 15 is cross-sectional view which schematically illustrates a structure of the semiconductor device according to the third embodiment.

FIG. 13 is a plan view which schematically illustrates a positional relationship of structural elements of a semiconductor device according to the second embodiment. FIG. 14 is a cross-sectional view taken along line A-A of FIG. 13, and FIG. 15 is a cross-sectional view taken along line B-B of FIG. 13. Further, structural elements corresponding to those shown in FIGS. 1 and 2 of the first embodiment are denoted by the same reference numerals as in the first embodiment, and their detailed explanations is omitted.

Also in the present embodiment, isolation regions 12 cross word lines 14 and upper insulating regions provided over the word lines 14 obliquely. Further, in the present embodiment, in addition to the isolation regions 12, isolation regions 52 are provided under the word lines 14.

Also in the present embodiment, the contact resistance can be reduced and an advantage similar to that of the first embodiment can be obtained.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor device comprising:
a semiconductor substrate;
a first isolation region and a second isolation region provided in the semiconductor substrate, the first and second isolation regions extending in a first direction and being adjacent to each other;
a first word line and a second word line provided in the semiconductor substrate, the first and second word lines extending in a second direction crossing the first direction and being adjacent to each other;
a first upper insulating region and a second upper insulating region provided on the first word line and the second word line, respectively, the first and second upper insulating regions extending in the second direction and being adjacent to each other;
a source/drain diffusion region provided in a surface area of the semiconductor substrate and between the first isolation region and the second isolation region, the source/drain diffusion region including a portion positioned between the first upper insulating region and the second upper insulating region; and
a first conductive portion provided in the source/drain diffusion region, the first conductive portion being provided between the first upper insulating region and the second upper insulating region, and the first conductive portion being formed of a material containing metal.

2. The device according to claim 1, wherein the first conductive portion is formed of a metal silicide.

3. The device according to claim 2, wherein the metal silicide contains nickel (Ni).

4. The device according to claim 1, wherein the first conductive portion is formed of metal.

5. The device according to claim 1, further comprising a second conductive portion provided on the first conductive portion and formed of a material containing metal.

6. The device according to claim 5, further comprising a contact plug connected to the second conductive portion.

7. The device according to claim 5, wherein a top surface of the second conductive portion is substantially on the same plane as top surfaces of the first and second isolation regions and top surfaces of the first and second upper insulating regions.

8. The device according to claim 1, wherein the first conductive portion is distant from the first and second isolation regions and the first and second upper insulating regions.

9. The device according to claim 1, wherein a bottom of the first conductive portion is located shallower than a bottom of the source/drain diffusion region.

10. The device according to claim 1, wherein the source/drain diffusion region further includes a portion positioned between the first word line and the second word line.

11. The device according to claim 1, further comprising a magnetic storage element electrically connected to the first conductive portion.

12. The device according to claim 1, wherein the first direction and the second direction orthogonally cross each other.

13. The device according to claim 1, wherein the first direction and the second direction obliquely cross each other.

14. A method of manufacturing a semiconductor device, comprising:
forming a first isolation region and a second isolation region, which extend in a first direction and are adjacent to each other, in a semiconductor substrate;
forming a first word line and a second word line, which extend in a second direction crossing the first direction and are adjacent to each other, in the semiconductor substrate;
forming a first upper insulating region and a second upper insulating region, which extend in the second direction and are adjacent to each other, on the first word line and the second word line, respectively;
forming a source/drain diffusion region, which includes a portion positioned between the first upper insulating region and the second upper insulating region, in a surface area of the semiconductor substrate and between the first isolation region and the second isolation region; and
forming a first conductive portion formed of a material containing metal, in the source/drain diffusion region and between the first upper insulating region and the second upper insulating region.

15. The method according to claim 14, wherein the first conductive portion is formed of a metal silicide.

16. The method according to claim 15, wherein the metal silicide contains nickel (Ni).

17. The method according to claim 14, further comprising forming a second conductive portion formed of a material containing metal, on the first conductive portion.

18. The method according to claim 17, further comprising connecting a contact plug to the second conductive portion.

19. The method according to claim 14, wherein forming the first conductive portion comprises:
forming a sidewall portion on the source/drain diffusion region and on an inner sidewall of a first hole defined by the first and second isolation regions and the first and second upper insulating regions;
forming a second hole in the source/drain diffusion region using the sidewall portion as a mask; and
forming the first conductive portion in the second hole.

20. The method according to claim 19, wherein forming the first conductive portion in the second hole comprises:

filling the second hole with a metal material; and
converting the metal material filling the second hole into a silicide to form the first conductive portion.

\* \* \* \* \*